(12) United States Patent
Guedj et al.

(10) Patent No.: US 7,189,952 B2
(45) Date of Patent: Mar. 13, 2007

(54) IMAGER HAVING PHOTOSENSITIVE MATERIAL CONTAINS POLYMORPHOUS SILICON

(75) Inventors: Cyril Guedj, Varces Allieres et Risset (FR); José Alvarez, Paris (FR); Yvan Bonnassieux, Paris (FR); Jean-Paul Kleider, Bures sur Yvette (FR); Norbert Moussy, St. Agnés (FR); Péré Roca I Cabarrocas, Villebon sur Yvette (FR); Svetoslav Tchakarov, Paris (FR)

(73) Assignees: Commissariat A l'Energie Atomique, Paris (FR); Centre National de la Recherche, Paris (FR)

( * ) Notice: Subject to any disclaimer, the term of this patent is extended or adjusted under 35 U.S.C. 154(b) by 249 days.

(21) Appl. No.: 10/519,012

(22) PCT Filed: Jun. 25, 2003

(86) PCT No.: PCT/FR03/01965

§ 371 (c)(1),
(2), (4) Date: Dec. 21, 2004

(87) PCT Pub. No.: WO04/001853

PCT Pub. Date: Dec. 31, 2003

(65) Prior Publication Data

US 2005/0224707 A1    Oct. 13, 2005

(30) Foreign Application Priority Data

Jun. 25, 2002  (FR) .................................. 02 07893
Jun. 25, 2002  (FR) .................................. 02 07894

(51) Int. Cl.
*H01L 27/00* (2006.01)
(52) U.S. Cl. .................................. 250/208.1; 250/239

(58) Field of Classification Search .............. 250/208.1, 250/239, 214.1; 257/290–292, 440
See application file for complete search history.

(56) References Cited

U.S. PATENT DOCUMENTS 4,926,052 A * 5/1990 Hatayama et al. ..... 250/370.14
5,682,037 A    10/1997 de Cesare et al.

(Continued)

FOREIGN PATENT DOCUMENTS

EP    0 726 605    6/1996

(Continued)

OTHER PUBLICATIONS

Afanas'ev et al., "Photodetector structures based on amorphous hydrogenated silicon with nanocrystalline inclusions", Dec. 2001, The Optical Society of America, J. Opt. Technol., vol. 68, No. 12, pp. 949-951.

(Continued)

*Primary Examiner*—Que T. Le
(74) *Attorney, Agent, or Firm*—Thelen Reid Brown Raysman & Steiner LLP

(57) ABSTRACT

Assembly of sensors formed as an imager with a detection brick including a photosensitive material, a brick for addressing and optionally processing signals from the sensor(s), an interconnection brick located between the detection brick and the addressing brick, this brick including connection pads, characterized in that the photosensitive material of the detection brick contains polymorphous silicon.

The invention also relates to a method for the making of the latter.

38 Claims, 8 Drawing Sheets

U.S. PATENT DOCUMENTS 6,018,187 A   1/2000   Theil et al.
6,114,739 A   9/2000   Theil et al.

FOREIGN PATENT DOCUMENTS

EP   1 050 907   2/2000

OTHER PUBLICATIONS

Chatterjee et al., "The origin of current gain under illumination in amorphous silicon *n-i-p-i-n* structures", Feb. 15, 2000, Journal of Applied Physics, vol. 87, No. 4, pp. 1874-1881.

Meaudre et al., "Midgap density of states in hydrogenated polymorphous silicon", Jul. 15, 1999, Journal of Applied Physics, vol. 86, No. 2, pp. 946-950.

Morral, et al. "In situ investigation of polymorphous silicon deposition", 2000, Journal of Non-Crystalline Solids 266-269, pp. 48-53.

Morral et al., "Structure of plasma-deposited polymorphous silicon", 2002, Journal of Non-Crystalline Solids 299-302, pp. 284-289.

Poissant et al., "Metastability study and optimization of polymorphous silicon solar cells: the state-of-the-art", 2002, Journal of Non-Crystalline Solids 299-302, pp. 1173-1178.

Razeghi et al., "Semiconductor ultraviolet detectors", May 15, 1996, J. Appl. Phys., vol. 79, No. 10, pp. 7433.

Topic et al., "Adjustable ultraviolet-sensitive detectors based on amorphous silicon", Apr. 16, 2001, Applied Physics Letters, vol. 78, No. 16, pp. 2387-2389.

Voz et al., "Thin-Film transistors with polymorphous silicon active layer", 2002, Journal of Non-Crystalline Solids 299-302, pp. 1345-1350.

* cited by examiner

IMAGER HAVING PHOTOSENSITIVE MATERIAL CONTAINS POLYMORPHOUS SILICON

CROSS-REFERENCE TO RELATED APPLICATION

This application claims priority based on International Patent Application No. PCT/FR03/01965, entitled "Imager" by Cyril GUEDJ, Jose ALVAREZ, Yvan BONNASSIEUX, Jean-Paul KLEIDER, Norbert MOUSSY, Pere ROCA I CABARROCAS and Svetoslav TCHAKAROV, which claims priority of French Application No. 02 07893, filed on Jun. 25, 2002 and French Application No. 02 07894, filed on Jun. 25, 2002, and which were not published in English.

TECHNICAL FIELD

The invention is in the field of photosensitive sensors, in particular in the visible wavelength range, i.e. approximately between 400 and 800 nm and in the ultraviolet wavelength range, i.e. approximately between 10 and 400 nm. These sensors include a layer possibly consisting of several sub-layers of a photosensitive material converting photons into electric charges. These sensors may exist in an isolated form or in the form of an assembly of sensors forming together an imager. The invention notably relates to sensors or a PIN or a NIP diode imager.

STATE OF THE PRIOR ART

A photosensitive sensor delivers an electrical signal, the amplitude of which, in an operating range, is an increasing monotonous function of the intensity of the light which it receives. Sensors are generally arranged in the form of a matrix of sensors formed with one or several columns, and with one or several lines.

UV sensors are generally arranged in the form of isolated sensors for detecting the presence of UV radiation or an assembly for UV imaging.

A matrix including several lines and columns is used in most image forming devices. Other configurations are known, in particular configurations wherein the pixels are arranged in polygonal structures, i.e., structures in which the sensors of the pixels occupy apexes of polygons, relatively to each other, for example regular triangles or pentagons or hexagons. These structures are used in particular for increasing the number of pixels per unit surface or for producing groups of pixels sensitive to different colors or to different wavelengths. Sensors which form together an imager are currently called "pixels" because each sensor then delivers an electrical signal corresponding to one pixel of an image to be formed.

References of the prior art documents which will be quoted in the application are recalled at the end of the description with the number between square brackets which is assigned to them in the present description.

U.S. Pat. No. 6,114,739 [1] describes the general shape of photosensitive sensors, the sensitive material of which is formed by an amorphous material. In the description of the prior art made in this patent, a general form of an assembly of sensors forming together an imager is described. This description is repeated hereafter in conjunction with the appended FIG. 1 which reproduces FIG. 1 of this patent.

This figure illustrates a cross-section of a network of sensors comprising a sensitive material also called active material.

The network of sensors is formed on a substrate 10. The substrate is generally of the CMOS (complementary metal oxide silicon) or BiCMOS (bipolar complementary metal oxide silicon) or bipolar type. The substrate may also include a great diversity of technologies, including CCD (charge coupled devices) type technologies.

An interconnection structure 12 connects this substrate to an n doped layer 14 which is above the interconnection structure 12. This layer 14 is used for forming with intrinsic i 16 and p doped 18 layers stacked over the layer 14, a network of photodetecting PIN diodes. The position of the diodes formed from layers 14, 16 and 18 is determined by the position of via conductors 20 formed as a matrix network in the interconnection structure 12.

A translucent conducting layer 24 is positioned above the matrix network of PIN diodes formed from layers 14, 16 and 18. This layer 24 forms an electrode for biassing the PIN diodes.

The substrate layer 10 generally includes a circuit for sensing the signal delivered by each diode and circuits for addressing and for an analog or digital processing of these signals.

Operation is as follows. An inverse bias voltage is applied between the electrode formed by the layer 24 and the substrate 10. The thereby generated electric field generates a current corresponding to the displacement of electric charges generated by photons which penetrate into the active material. The current from the sensitive material zones which are found straight above a via 20, is preferentially directed through this via 20 towards a signal sensing circuit. Each of the vias 20 thereby receives a current which is a function of the illumination received by the sensitive material surface found above this via 20. The different signals are then processed by the addressing and processing circuits included in the substrate 10 for example.

As explained in U.S. Pat. No. 6,114,739 [1], a limitation of the image sensor structure which has just been described comes from the fact that the different individual sensors, the signal of which corresponds to one pixel of the image to be formed, are not electrically insulated from each other. In particular, a current formed according to the light received by a surface found straight above a first via 20 may very well leak towards one of the neighboring consecutive vias 20. In terms of image, each of the pixels trickles onto the neighboring pixels so that the pixels of an image formed from the imager are not clearly separated from each other. A first method for reducing this flaw as explained in the description of the prior art, appearing in U.S. Pat. No. 6,114,739 [1], consists of providing slots in the p or n layer 14 found above the vias 20. These slots provide better individualization of each of the diodes found in the alignment of a via 20, and accordingly, better separation of the pixels of an image.

U.S. Pat. No. 6,114,739 [1] describes an improvement of this prior art intended for improving separation. This improvement is described in conjunction with FIG. 2 of this patent. Each detecting diode is further individualized by the fact that it is equipped with its own electrode. FIG. 2 of the drawings appended to the present application reproduces FIG. 2 of this patent [1] while keeping the reference numbers assigned in FIG. 1 for the components with the same function as those in FIG. 1. In the embodiment of FIG. 2, the n or p layer 14 added in dotted lines in FIG. 2 appended to the present application, is etched after deposition, so that only portions 44 found above a via 20 are allowed to subsist. Moreover, a contact conduction layer is also deposited immediately above the interconnection structure 12. This contact layer is etched in same way as the n layer 14. An unremoved portion 45 of this layer forms with a remaining portion 44 of the n layer 14, an electrode of a PIN or NIP diode. Thus, as the n layer 14 is cross-linked, each of the diodes contributing to the delivery of the signal for forming an image pixel is individualized in a better way than in the prior art.

The photosensitive material forming the sensitive layer 16 of the diodes is an amorphous material, for example amorphous silicon or amorphous carbon, or amorphous carbonaceous silicon or amorphous germanium or even amorphous germanium-silicon. It is specified that this list is not exhaustive. A way of achieving the produced structure in FIG. 2 is described in this patent in conjunction with FIGS. 3–7 of this patent, which each illustrate the structure at different stages of its production.

The significance of a structure such as illustrated in FIG. 1 or 2, is that it splits up the detection portion from the addressing, interconnection, signal processing portion. Thus, layers 14, 16, 18, 24 together form a detection brick 50. The substrate 10 and the connection and possibly the signal processing circuits associated with this substrate form a processing brick. Both of these bricks are interconnected through the interconnection brick 12. With this modular approach, highly integrated compact low cost imagers may be made, i.e., which include a large number of individual detectors per unit surface and use little current.

A drawback of this type of structure, wherein the active array is formed by an amorphous material, is that the performances are poor in terms of signal dynamic range and maintaining performances with ageing. For example, amorphous silicon is known to have a large density of defects, of the order of $10^6$ per $cm^3$. These defects cause a limitation of the possible operating rate because they induce retention of the delivered signal and therefore of the image. These structures are thus unsuited to a use for producing successive images with a high repetition frequency. Finally, the structure regularly deteriorates during the illumination times, which is detrimental to the service life of the imager. Moreover, it incurs a high risk of deterioration or even destruction, under strong illuminations.

Reference article [2] reports different existing UV detectors.

Conventionally, the semiconductor detectors used for UV detection are P-I-N diodes in crystalline silicon. Recently, materials of the GaAlN and SiC type have been used for producing UV detectors, insensitive to visible light (visible-blind) and to solar radiation (solar-blind).

U.S. Pat. No. 5,682,037 [3], filed in 1996, describes an exemplary embodiment of a SiC-based UV sensor. In the description of the prior art made in this patent, the following is first stated at the beginning of column 2: "Crystalline silicon photodiodes have optimal efficiency in the visible range and can only be used for UV detection after sophisticated and costly optical and mechanical treatments. They require low voltage power supplies and may be arranged into a network with dimensions of a few centimeters".

UV CCD devices are components based on crystalline silicon which also require a very special treatment. These are multichannel detectors which are very sensitive and have a high signal-to-noise ratio, in particular when they operate at low temperature. The photogenerated electrons are collected in an array of pixels and are then read out sequentially. It is thus possible to reconstruct a two-dimensional image. There are at least three major disadvantages in UV detection by CCD devices, i.e., cost, the impossibility of obtaining two-dimensional CCD arrays with large dimensions and the requirement of filtering visible light or other radiations when the UV radiation to be detected needs to be detected on a background of visible light and other radiations.

The invention described in patent [3] is directed to solving the problem of filtering visible and infrared radiations, of electric power consumption, of large scale integration and additionally for a lesser cost.

The described invention provides optimization of the thickness and absorption coefficient of the layer of amorphous conductors forming the junction, as well as the geometrical shape of a metal grid used as front electrode. In addition to increasing efficiency so that it is maximum in the UV range, the invention provides adjustment of the operating range of the detector so as it makes it capable of detecting near or far UV radiation depending on the application. It has already been demonstrated that by acting on the deposition parameters and on the impurity concentration in the silicon alloy, absorption may be optimized for visible light or infrared light. The physical parameters to be optimized are the absorption profile and thickness of the detector. This optimization may be obtained by controlling the deposition parameters, i.e., notably deposition time and carbon percent in the alloy.

Optimization and reproducibility of the thickness of the layers are made possible by controlling the radio frequency discharge (glow discharge) of the coating. The absorption coefficient provided by hydrogenated amorphous silicon, itself depends on the fundamental properties of the material, such as the width of the forbidden band of the semiconductor and the density of states in the band. The latter in turn depend on the growth parameters of the layer in a very complicated way. A simple and reproducible way for varying the profile of the absorption coefficient versus the wavelength is to form silicon/carbon or silicon/germanium alloys with known percentages. This is achieved by introducing into the deposition chamber, a controlled flow of gaseous methane or germane, respectively. The obtained carbon/silicon alloy is an amorphous semiconductor, with a forbidden band of higher energy than amorphous silicon, which penalizes absorption of visible and infrared light as compared with UV light.

However, the obtained a-SiC alloy should not contain a too high carbon percentage, relatively to silicon, because its electronic properties would suffer therefrom.

In conjunction with FIGS. 1a and 1b of this patent [3], the general embodiment of the invention of patent [3] is described.

FIG. 1a illustrates a top view of a sensor as described in [3] and FIG. 1b illustrates a cross-section of said sensor.

The sensor comprises from bottom to top, as illustrated in FIG. 1b, a substrate for example in glass, but, preferably in quartz, in order to let ultraviolet radiation to pass through it. It then includes a transparent conductor 4, and an $n^+$ doped hydrogenated amorphous silicon layer. The sensitive material is formed by two sublayers of hydrogenated amorphous carbonaceous silicon (a-SiC: H), one being $n^+$ doped and the other $p^-$ doped, finally, by an amorphous hydrogenated carbonaceous silicon $p^+$ layer 2, covered with a conducting grid 5. It is pointed out that it is preferable to work at zero bias between electrodes 4 and 5.

The difficulty consists in maintaining electro-optical performances under illumination as the amorphous material tends to deteriorate under UV illumination. Moreover, the external quantum efficiency (capability of converting photons into electric charges) is low from the nature of the material.

In the case of diodes based on crystalline silicon, growth is achieved at a very high temperature (above 400° C.), which makes it incompatible with direct deposition on the CMOS readout circuit on substrate Si.

SUMMARY OF THE INVENTION

The object of the present invention is a light sensor in particular for the visible wavelength range, unique or arranged in an assembly of sensors forming together an imager. The present invention is also directed to allowing a UV imager to be produced on a circuit, for example a CMOS circuit, by the fact that the sensitive layer may be deposited at a lower temperature, for example of the order of 300° C. or less.

A light sensor optionally arranged in an assembly of sensors forming together an imager, according to the present invention, further has the advantages of the modular systems described above:

enhanced time response, i.e., the rise and fall times of the value of the signal delivered according to the variations of the illumination, more closely following the variations even when these variations are fast, low image retention, and therefore allowing successive images to be produced with a high repetition rate, better resistance to ageing, and increased resistance to strong illuminations.

Moreover, the imagers made with the sensors, are adapted to large integration, i.e., they operate properly even with a large number of pixels per unit surface.

In particular, the invention proposes a strong increase of sensitivity for wavelengths between 10 and 400 nm, while reducing sensitivity to parasitics around 700 nm.

Finally, with an imager according to the invention, it is possible to use a larger range of readout circuits, in particular including readout circuits with switching of bias between each readout. This possibility becomes open because of the large time dynamic range of the photosensitive material.

For all these purposes, the invention is related to a unique sensor or an assembly of visible light sensors, formed as an imager, each sensor delivering a signal corresponding to one pixel of the image, and having, a detection brick with a detection zone including a photosensitive material, a brick for addressing and possibly processing signals from the sensor(s), this brick notably having an addressing circuit and, an interconnection brick located between the detection brick and the addressing brick, this brick having connection pads connecting pixels of the imager to the addressing circuit, so-that the signals from the pixels are individualized, characterized in that the photosensitive material of the detection brick contains at least one polymorphous silicon layer.

The invention is also related to a sensor or an assembly of sensors for ultraviolet radiation, each sensor delivering a signal corresponding to one pixel of the image, and having, a detection brick with a detection zone including a photosensitive material, a brick for addressing and possibly processing signals from the sensors and, an interconnection brick located between the detection brick and the addressing brick characterized in that the photosensitive material of the detection brick contains polymorphous silicon with a thickness less than 0.4 µm and preferably between 0.01 and 0.05 µm.

Selectivity for the sensitive frequency range may be determined by selecting a temperature for depositing the polymorphous silicon layer, between 150° C. and 250° C., with a pressure between 1,300 and 1,800 mTorrs.

Polymorphous silicon has a low density of states for defects in the middle of the forbidden bands and a high product of the carrier mobility times the lifetime of said carriers. On this subject, reference may be made to reference article [4], the reference thereof appearing at the end of the document. Consequently, the time dynamic range, i.e., the capability of a detector made in this way, of following time variations of an illumination, is improved at high illumination variation or electric bias rates. Image retention is reduced and it therefore becomes possible to produce successive images with a high repetition rate. Moreover, it was seen that the performances of an imager made with a structure according to the invention had better stability over time, notably under strong illuminations.

Preferably, the interconnection brick is formed by pads embedded into the insulator.

Preferably, the interconnection pads are either in aluminium or copper or tungsten.

Preferably, the insulating material embedding the pads is formed by a stack of dielectric layers forming Bragg mirrors.

Preferably, electrodes are formed above the pads, these electrodes having a lower surface electrically coupled with a pad, and an upper surface, the upper surface of the electrode having a larger surface dimension than the lower surface in contact with the pad.

Preferably, the upper surface of the electrodes has a shape of a cup.

Preferably, a lower portion of each electrode is embedded into an insulator layer, an upper portion of this electrode appearing above said insulator layer.

Preferably, the insulator layer surrounding a lower portion of the electrodes is formed by a stack of layers forming Bragg mirrors.

Preferably, the electrodes are either in aluminium, copper or tungsten or titanium or titanium nitride or chromium or a doped semiconductor or an organic conductor or a conducting oxide or finally even a composite stack of the materials mentioned above.

Preferably, the layer of polymorphous material is placed above the layer including the insulator and the electrodes.

Preferably, at least an upper silicon layer has a lower portion containing carbon and an upper portion containing boron.

Preferably, the thickness of the polymorphous material layer of a sensor or an assembly of sensors for visible light is between 0.5 and 2 µm.

Preferably, the detection zone including polymorphous silicon is an intrinsic area of a PIN or NIP diode.

The invention also relates to a method for making an assembly of photodetectors according to any of the embodiments of this assembly, characterized in that:

after making a substrate, notably including an addressing circuit, and optionally signal processing circuits, one or more layers of insulating materials are deposited, said layer is etched in order to form holes in this layer, some holes are filled with conducting material thereby forming interconnection pads (5, 5'), mechano-chemical polishing is carried out optionally, one or more sublayers of insulating material are deposited, said insulating material sublayer is etched above pads, a layer is deposited above the etched insulator layer, thereby forming a non-planar layer of conducting material, cups appearing above the pads, the conducting material layer which has just been deposited, is etched in order to form electrodes separated from each other, an unintentionally doped polymorphous material layer is deposited, a doped layer is deposited, finally, a conducting material layer forming an upper electrode is deposited.

Preferably, the temperature for depositing the polymorphous material is between 175° C. and 250° C. and the pressure for deposition is between 1,300 and 1,800 mTorrs.

Preferably, deposition of the polymorphous material is followed by deposition of a layer containing carbon, at least in its lower portion.

BRIEF DESCRIPTION OF THE DRAWINGS

The invention will now be described with the help of the appended drawings wherein:

FIG. 1b, already described, shows a cross-sectional view of said photodetector of the prior art illustrated in FIG. 1a;

FIGS. 4–6 show different ways for characterizing polymorphous silicon;

FIG. 4 illustrates the exodiffusion spectrum of polymorphous silicon;

FIG. 5 illustrates curves of the infrared absorption spectrum;

DETAILED DESCRIPTION OF PARTICULAR EMBODIMENTS

As explained above, as compared with the prior art, the invention consists of replacing an amorphous material forming the active layer with polymorphous silicon.

First of all, it will be pointed out how it is possible to recognize polymorphous silicon from amorphous silicon upon examining them. The structure of polymorphous silicon is schematized in FIG. 3. Polymorphous silicon includes a matrix 100 wherein aggregates and nanocrystals 101, 102, etc. n, n being larger than 102, illustrated by black spots with variable shape and size, are incorporated. With microscopy measurements, it may be shown that the matrix containing the nanocrystals has medium range order between the second and sixth neighboring atoms. The nanostructure of polymorphous silicon is also notably characterized by infrared absorption, by microscopy, Raman spectroscopy. It may also be characterized by a hydrogen exodiffusion spectrum clearly distinct from that of amorphous silicon.

Figure 4:
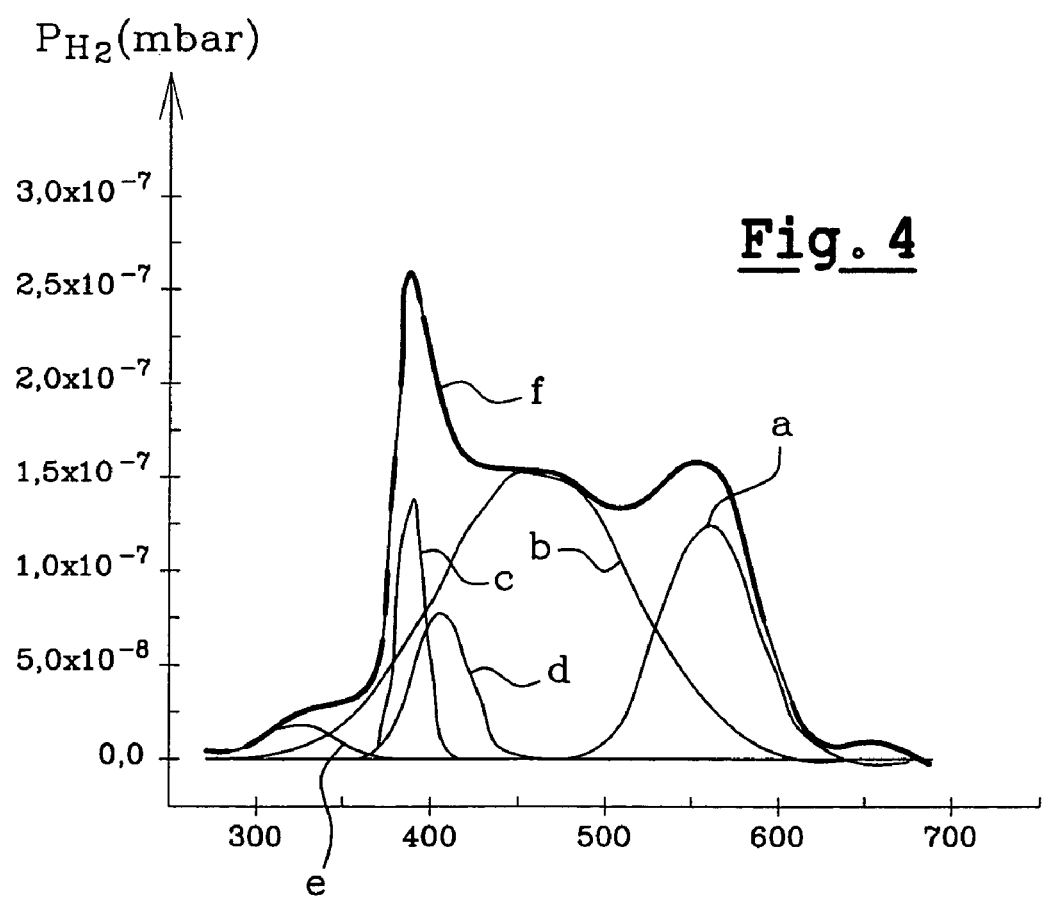
Figure 5:
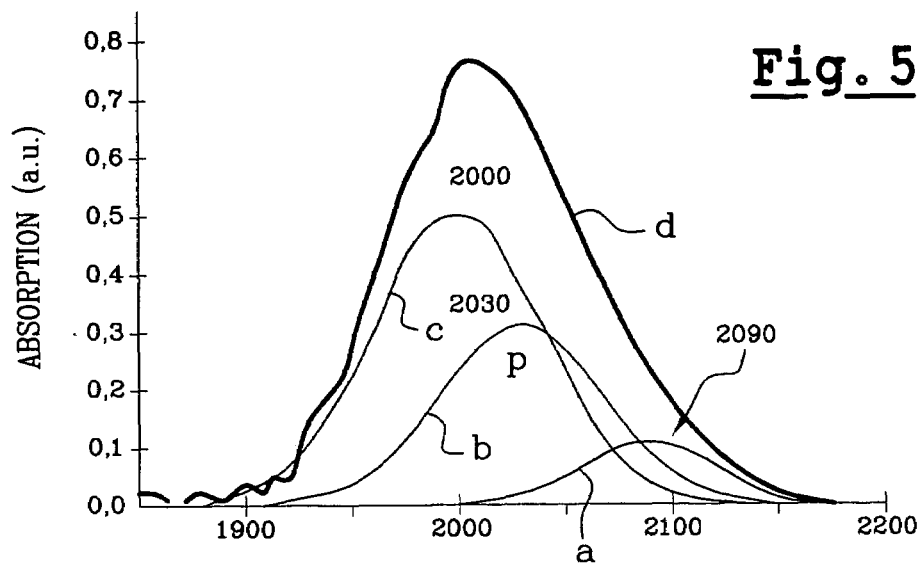

For example, differences which may be observed between amorphous silicon and polymorphous silicon are given in FIGS. 4–6.

FIG. 4 illustrates the exodiffusion spectrum for polymorphous silicon. This spectrum is defined by curves illustrating the partial pressure of hydrogen in millibars, versus the material temperature in ° C. The way of producing these spectra is well known in the art. Explanations for globally understanding what is going on here are given hereafter to facilitate understanding. The partial pressure of hydrogen leaving the material is measured versus the annealing temperature. Hydrogen is bound to the material according to different atomic configurations which each have a different binding energy. Each binding configuration therefore corresponds to a hydrogen evolution curve versus temperature, existing as a bell-shaped curve with a peak. The spectrum of amorphous silicon has the shape illustrated by curve a. It only shows a peak between 500 and 600° C., associated with hydrogen being uniformly distributed in the amorphous matrix. Curves b, c, d and e, respectively illustrate hydrogen evolution curves each corresponding to a specific binding configuration of hydrogen. When exodiffusion from polymorphous silicon is measured, curve f is obtained, which corresponds to the resultant of different binding configurations of hydrogen which exist in the polymorphous material. The shape of f thereby characterizes incorporation of hydrogen at the surface of aggregates and nanocrystals, and in the matrix having medium range order.

Another way of recognizing polymorphous silicon from amorphous silicon will now be described in conjunction with FIG. 5 which illustrates the infrared absorption spectrum in the zone for which the wave number expressed in $cm^{-1}$ is between 1,900 and 2,200. Absorption, in an arbitrary unit, is plotted in ordinate and the wave number is plotted in abscissa. Curve d illustrates the experimental result from the measurement of absorption. Curves a, b, c, respectively illustrate curves obtained by a deconvolution calculation which may be performed since the different elementary absorption peaks are known. This deconvolution of the experimental spectrum shows the presence of an extra peak p between 2,030 and 2,050 $cm^{-1}$ for polymorphous silicon. This peak corresponds to curve b. The position of the peak depends on the conditions during the making of the polymorphous silicon.

Figure 6A:
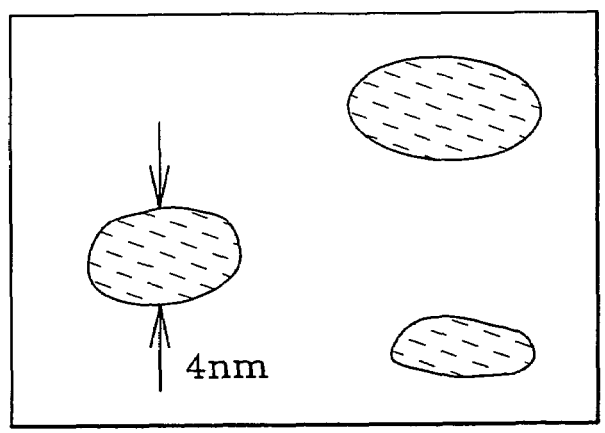
FIGS. 6a and 6b, respectively illustrate a high resolution transmission electron microscopic image (HRTEM) of a polymorphous material and its spatial Fourier transformed equivalent to an electron diffraction spectrum.
Figure 6B:
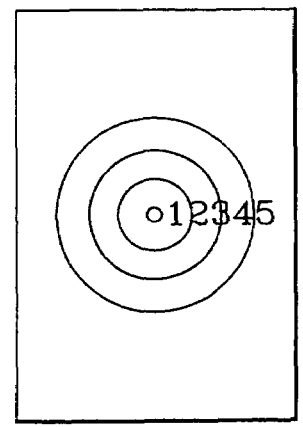

Finally, a diagram of a high resolution image, obtained by transmission electron microscopy (HRTEM), of polymorphous material in which crystals with a diameter of a few nanometers may be distinguished, is illustrated in FIGS. 6A and 6B. These nanocrystals appear on the photograph as regions in which are seen lines parallel to each other. These nanocrystals have been illustrated in FIG. 6A by regions inside which appear dotted lines parallel to each other. A medium range order may be shown by a spatial Fourier transform of the image of the amorphous zone. This transform is schematized in FIG. 6B. Medium range order is materialized by the presence of rings surrounding a common point. For amorphous silicon, two rings and possibly a third very blurred ring may be seen. For polymorphous silicon, four materialized rings in FIG. 6b may be distinguished by the presence of white and black rings. Further, the rings have a greater intensity and a finer width than in the case of amorphous silicon. On this subject, reference may be made to reference article [5] referenced at the end of the description.

Figure 7:
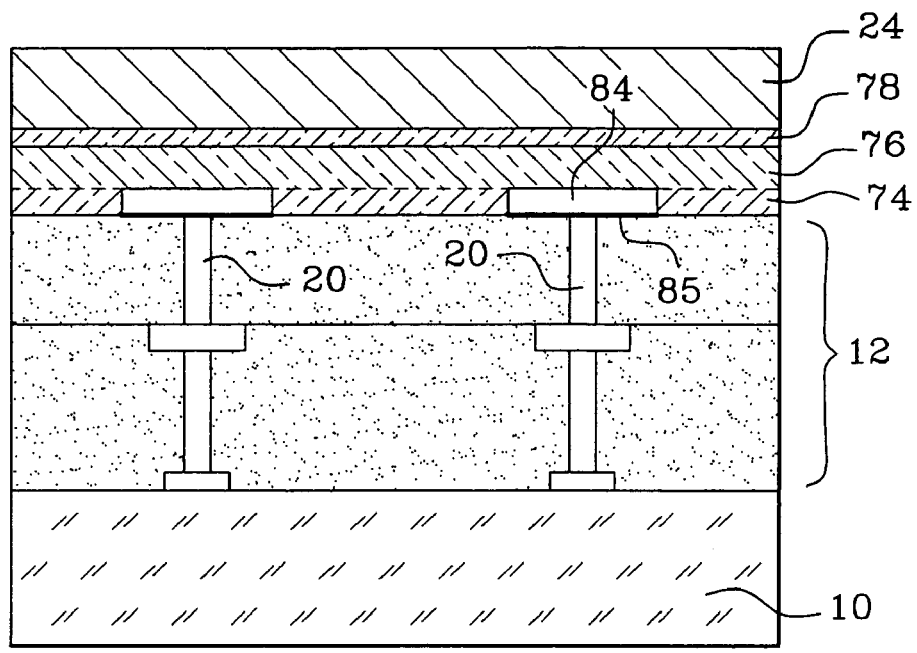
FIG. 7 illustrates an embodiment of the invention which corresponds to FIG. 2, and wherein the photosensitive material is polymorphous silicon.

A first exemplary embodiment of an assembly of photo detectors according to the invention will now be described with reference to FIG. 7. This figure exactly reproduces FIG. 2 from the prior art. In this figure, items with the same reference number as those of FIG. 2 refer to items having the same function, and they may be made in the same way. As for FIG. 7 which reproduces the embodiment of FIG. 2, the only difference being that the amorphous material forming the layer i 16 is now replaced with a layer of polymorphous silicon. Layer n 14 has now been cut out only allowing electrodes 84 to subsist. Layers i 16 and p 18 are referenced as 76 and 78, respectively. Contact layer 45 is replaced with contact layer 85.

A preferred embodiment will now be described in conjunction with FIG. 8.

Figure 1:
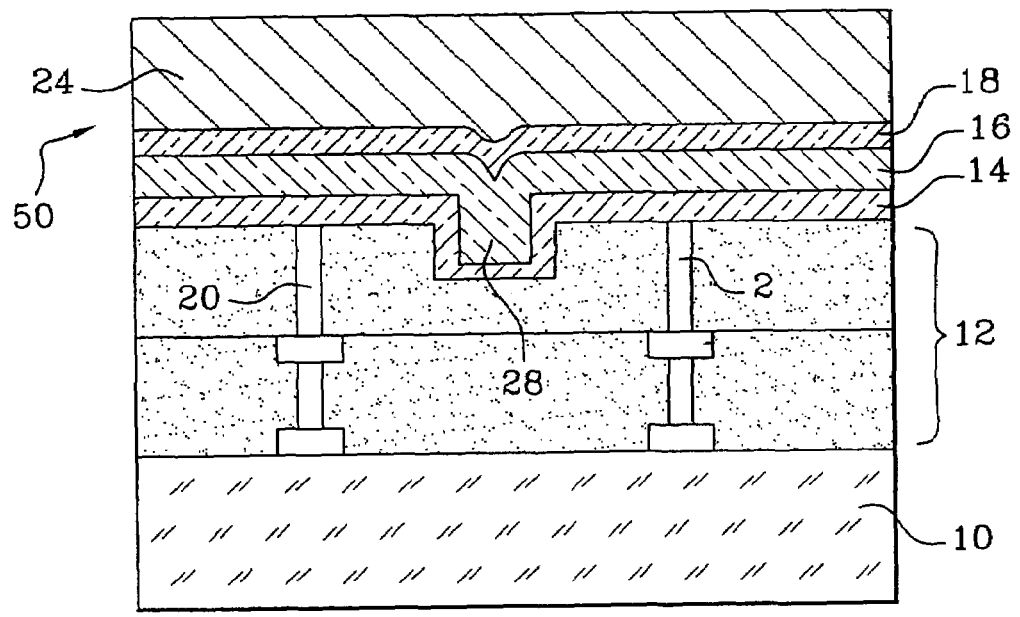
FIG. 1, already described, shows a cross-sectional view of a structure of a photodetector according to the prior art.
Figure 2:
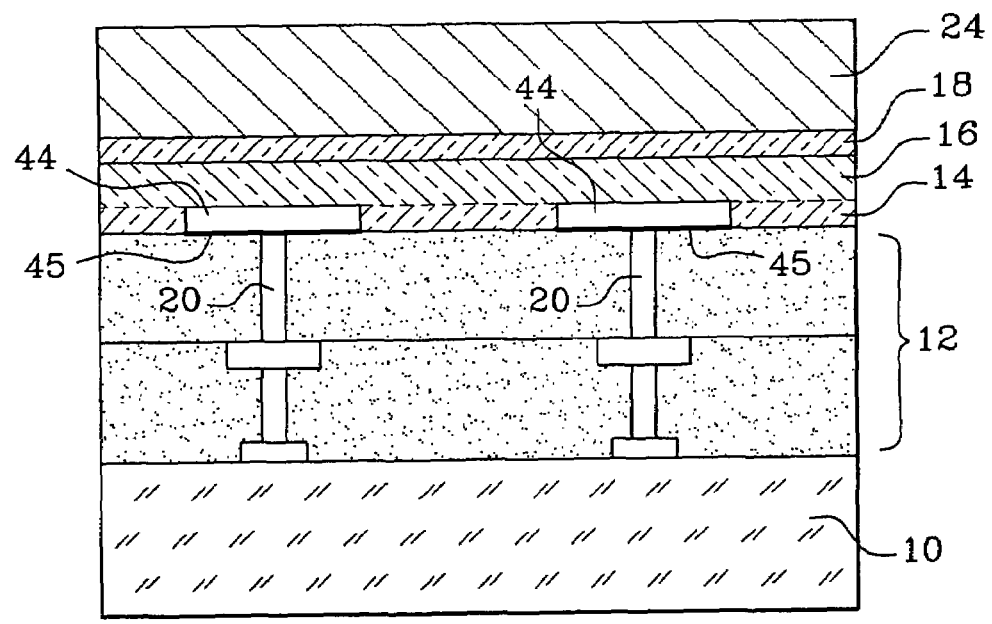
FIG. 2, already described, shows a cross-sectional view of another photodetector of the prior art.
Figure 1A:
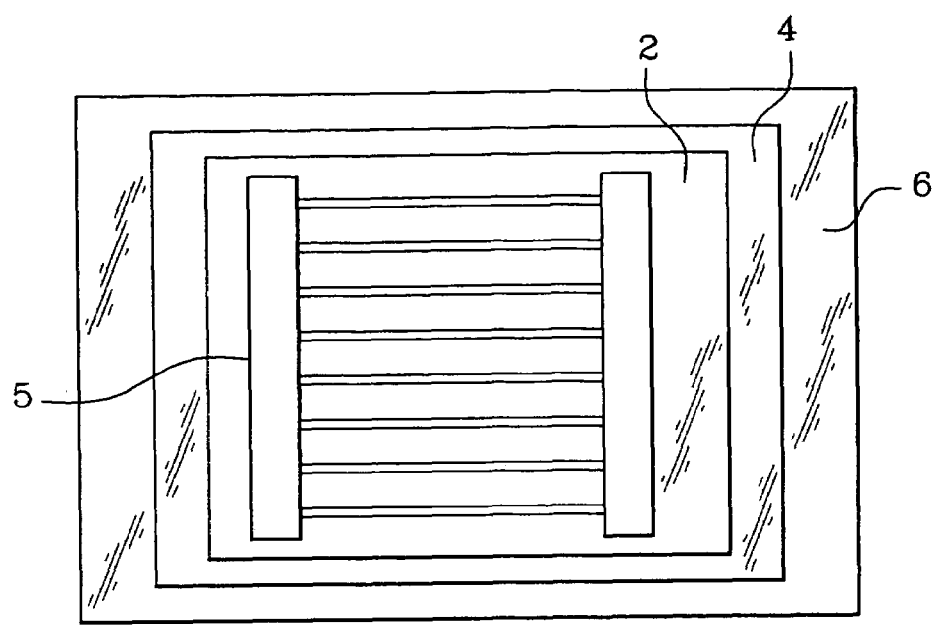
FIG. 1a, already described, shows a top view of a structure of a photodetector according to the prior art.
Figure 1B:
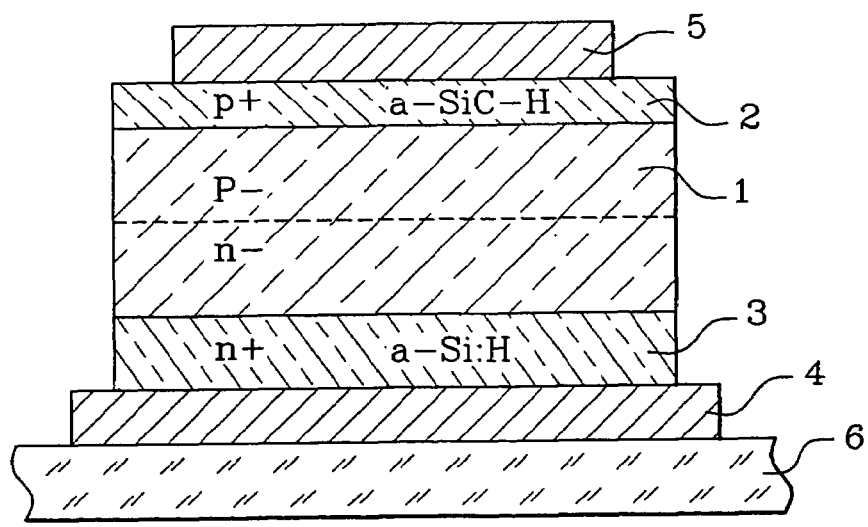
Figure 8:
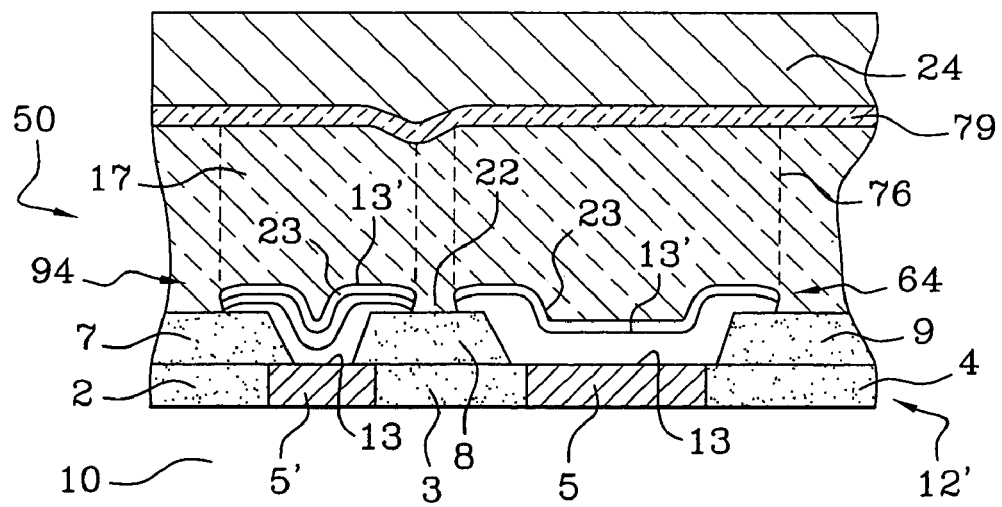
FIG. 8 illustrates a particular embodiment of the invention according to two alternatives.

This embodiment differs from the embodiments of the prior art, in particular the one described in conjunction with FIG. 2, as in the general case, by the use of a polymorphous material for forming the active layer on the one hand, but also by the embodiment of the interconnection layer illustrated at 12', in FIG. 8, and by the shape of the electrodes, two drawings of which are illustrated in FIG. 8 under reference numbers 94 and 64.

Figure 9:
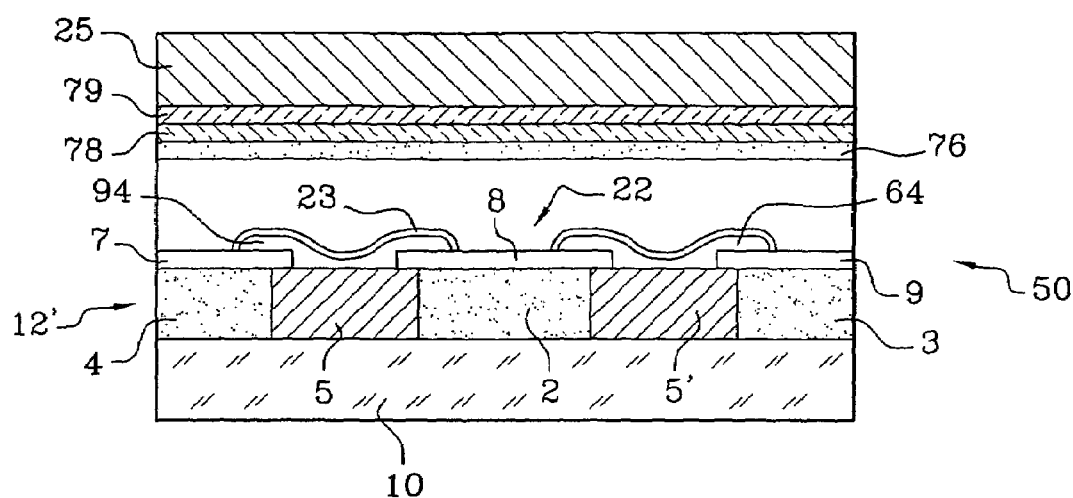
FIG. 9 illustrates curves of residual dark current divided by the photon current versus optical power, for amorphous silicon on the one hand, and for polymorphous silicon on the other hand.

In the embodiment described in conjunction with FIGS. 8 or 9, the substrate 10 may have any configuration already known from the prior art. This substrate will therefore not be described.

An embodiment of the layer 12' forming the interconnection brick 12' according to this embodiment of the invention, as well as methods for making this brick above substrate 10, will now be described.

This layer includes conducting pads 5, 5' embedded in an insulated material completely filling side spaces 2, 3, 4 between the pads 5, 5'.

Two embodiments of the interconnection pads are illustrated as 5 and 5' in FIG. 8. These pads are formed above the substrate 10. In the example illustrated in FIG. 8, pads 5 and 5' are cylindrical. The pads may also be cubic or conical with their smallest base located on the side of the substrate for example, or with bases having different surfaces, for example hexagonal surfaces. These pads are equal or greater in number than the pixels of the imager which one wants to form. On this subject, reference may be made to the reference patent [6] in which an imager is described in conjunction with FIG. 7 of this patent, un which interconnection links 56 provide functions other than the functions for connecting a diode to an addressing circuit. Pads 5, 5' of the embodiment of the invention described in conjunction with FIG. 8 appended to the present application, are formed in aluminium.

Pads 5, 5' may also be transparent, mono- or multi-layered, with any sizes and geometrical shapes. Their function is to transmit electrical information between the substrate 10 and the diode. This notably requires proper mechanical adhesion between an interconnection pad 5 and the lower electrode 64, 94.

Methods for forming the interconnection pad 5 are well known in the field of microelectronics and optoelectronics. The pads 5 may be made for example by depositing a continuous conducting layer, by etching cuts around the pads and by filling the cuts with electrically insulating material.

Naturally, the layer 12' may also and preferably be made by first depositing the insulating material, then by etching holes at the position of the pads 5, 5'. The holes are then filled with conducting material(s) forming the pads 5, 5'.

In both production methods which have just been described, the shape illustrated by layer 12' in FIG. 8 is obtained, wherein the insulating material is located in the spaces 2, 3, 4 between the pads 5, 5'. A planar surface may then be obtained by optional additional mechano-chemical polishing.

The shape of the pads 5 results in part from the geometry of the etching and in part from the etching method.

It is also possible to use lift-off techniques or any other known method for obtaining this type of structure.

The materials of pads 5 or 5' generally are of the metal type like aluminium, copper or tungsten, but it is also possible to use other conducting materials such as titanium, titanium nitride, a conducting transparent oxide, a conducting organic material, or any other material providing electrical conduction without deteriorating mechanical adhesion between the pad and the electrode which is located above. Another important characteristic of the pads 5, 5' is that they do not deteriorate too much over time by oxidization or electro-migration or under the effect of temperature. The pad 5 used should notably withstand, without being deteriorated, the temperature for depositing the materials forming the detection brick 50, typically a temperature of 300° C. for at least 1 hour.

It will be seen later on that depositing the photosensitive material assumes that the substrate 10 provided with the layer 12' may be submitted to this temperature for at least one hour. The diffusion constant of the material forming a pad 5 should be sufficiently small so as not to compromise insulation of both adjacent pixels upon completion of annealing at 300° C. for one hour. Also, the insulating materials used in spaces 2, 3, 4 between the pads and in the spaces 7, 8, 9 between the electrodes which will be discussed later on, should retain their dielectric properties upon completing the same treatment. These materials will preferably be selected in the family of dielectric materials used in micro-electronics, for example silicon oxide or silicon nitride, but not exclusively.

If necessary, it is also possible to use for the material filling the side spaces between the pads and/or between the electrodes, a stack of dielectric layers in order to produce Bragg mirrors to prevent light from reaching the substrate. Any composite arrangement of material, with any shape or geometry, may be used provided that it meets requirements on electrical insulation, mechanical stability and durability, both over time and in temperature.

The shape of the electrodes 64, 94 and the method for making them, will now be described.

It should be understood that in a same imager, the electrodes may all have the same shape, but not necessarily.

Electrodes 94 and 64 preferably have a shape such that the surface area 13 of their zones in contact with a pad 5 is less than the opposite surface area 13', which is in contact with the layer 76. The contact surface area 13 between an electrode 94, 64, and the contact pad 5 may be less than the surface area of a pad 5 as illustrated for the electrode 94 in FIG. 8 or on the contrary be equal as illustrated at 64. In the case illustrated at 64, the surface area of the pad 5' is less than the lower surface area 13 of the electrode 64. The surface 13' opposite to the contact surface 13 of the electrode 94 has a shape providing a larger electrode surface area in an identical occupied space. This means that the upper surface area 13 of the electrode 94 is larger than the surface area of a cross-section 17 of the pixel. The cross-section of said surface of the pixel is illustrated in dotted lines in FIG. 8. This electrode may be provided with a larger surface by the concaveness of the electrode 94. Also, in the example illustrated at 64, the upper surface 13' of the electrode has a larger surface area than the surface occupied by a cross-section of the pixel. Insulating material completely fills spaces 7, 8, 9 which are in a side position around a lower portion of the electrodes.

Current leaks between pads 5, 5' and a fortiori short circuits may be avoided with the insulating material which fills regions 2, 3, 4 between pads 5, 5' and 7, and 8 and 9 between electrodes 94, 64. Electrodes 94, 64 have the purpose of providing electrical contact between the polymorphous silicon 76 region i and pad 5.

Electrodes 94, 64 are also obtained by standard methods of micro-electronics, such as for example by depositing a continuous dielectric layer, etching holes, this etching allowing side spaces 7, 8, and 9 to subsist between the electrodes. Deposition of the conducting layer(s) forming the material of the electrodes is then performed.

So the cup shape of the electrodes naturally results from the presence of holes in the etched insulator layer. The electrodes 94, 64 may be separated from each other by etching the conducting layer or zones 22 between electrodes 94, 64.

The electrodes may also and preferably be formed from a stack of layers notably including, as illustrated in FIGS. 8 or 9, between the layer 76 and the electrode 64, 94, a TiN or Ti layer 23 playing the role of a diffusion barrier. Electrode 94 or 64 may also end with a doped silicon layer or a doped $Si_{1-(x+y)}Ge_xC_y$ (x between 0 and 1; y between 0 and 1) alloy surface layer of type n or p, or with a semiconductor layer doped with ions for example with metal ions, but not exclusively. Electrodes 94 and 64 may also be encapsulated by a layer of organic conductors such as an organic polymer for example.

The materials forming the electrodes 94 and 64 are selected from conducting materials, provided that they meet the requirements on mechanical, chemical, thermal stability, and stability over time, compatible with the adjacent materials, and the global heat balance of the method for making the imager. The materials forming the electrodes 64, 94 will notably be selected from aluminium, copper, tungsten, titanium, titanium nitride, a doped semiconductor compatible with neighbouring materials, an organic conductor, a conducting oxide, or any composite stack or arrangement of such materials.

Region 76, which will now be described, is the active portion of the elementary photosensitive component; it includes at least a polymorphous silicon region. Region 76 is an i zone for example if the detection diodes are PIN or NIP diodes.

Region 76 preferentially includes an unintentionally doped polymorphous layer neighbouring a region including silicon and optionally a dopant and optional carbon. Region 76 may contain a gain zone, for example (on this subject, reference may be made to reference article [7]), doped zones of different nature and geometry, or any useful arrangement of material and geometry, provided that it contains at least a region including polymorphous silicon.

In the embodiment illustrated in FIG. 8, a silicon layer 79 is present at the top of the layer 76 immediately below the layer 24 forming an electrode. This layer 79 in its upper portion forms the p zone of the diode, by doping silicon with boron. In its lower portion, it may advantageously contain carbon. The quality of the interface between the i and p layers is thereby enhanced. This layer 79 may also replace the p layer 78, appearing above the i layer illustrated in FIG. 7.

Preferably, for a visible light sensor, the sensitive i layer 76 in polymorphous material will have a thickness between 0.5 and 2 μm.

The region 24 illustrated in FIG. 8 has the purpose, as in the prior art, of forming an electrode for collecting charges, while allowing visible light to pass through it so that it reaches region 76. Preferably, it will be made in ITO (indium and tin oxide) or based on any conducting transparent oxide or any other transparent and conducting material, including conducting organic polymers.

Surprisingly, it was seen that using polymorphous silicon as a sensitive material, led to imagers having lowered image retention in spite of the presence in the material of a large number of interfaces between the matrix and the nanocrystals and aggregates.

In the embodiment illustrated in FIG. 8, silicon layers 78, 79 are present on the top of the layer 76 immediately below a layer 25 forming an electrode which will be discussed later on.

Layer 79 forms the p zone of the diode, by doping silicon with boron. Layer 78 may advantageously contain carbon. Quality of the contact is thereby enhanced.

Preferably, for an ultraviolet imager, the sensitive i layer 76 in polymorphous material will have a thickness less than 0.4 μm and preferably around 0.05 μm.

Deposition of the layer 76 in polymorphous silicon will now be described.

Polymorphous silicon is obtained by PECVD (Plasma Enhanced Chemical Vapor Deposition) methods at low temperatures between 100 and 400° C., from the dissociation of pure silane or mixed with other gases (He, $H_2$, Ar), under conditions close to forming a powder. Generally, polymorphous silicon is obtained by adjusting technological parameters of the plasma from which deposition is made: pressure, dilution, and radiofrequency power, which result in the formation of aggregates and nanocrystals in the plasma. On this subject, reference may be made to reference article [5]. The polymorphous material is therefore formed from the incorporation of aggregates and nanocrystals which impart to polymorphous silicon its specific properties, particularly adapted to detection. Indeed, in spite of the microstructure, the presence of aggregates and nanocrystals, induces a low density of defect states and a large product mu tau (carrier mobility times carrier lifetime) typically 100 times larger than that for amorphous silicon.

Figure 10:
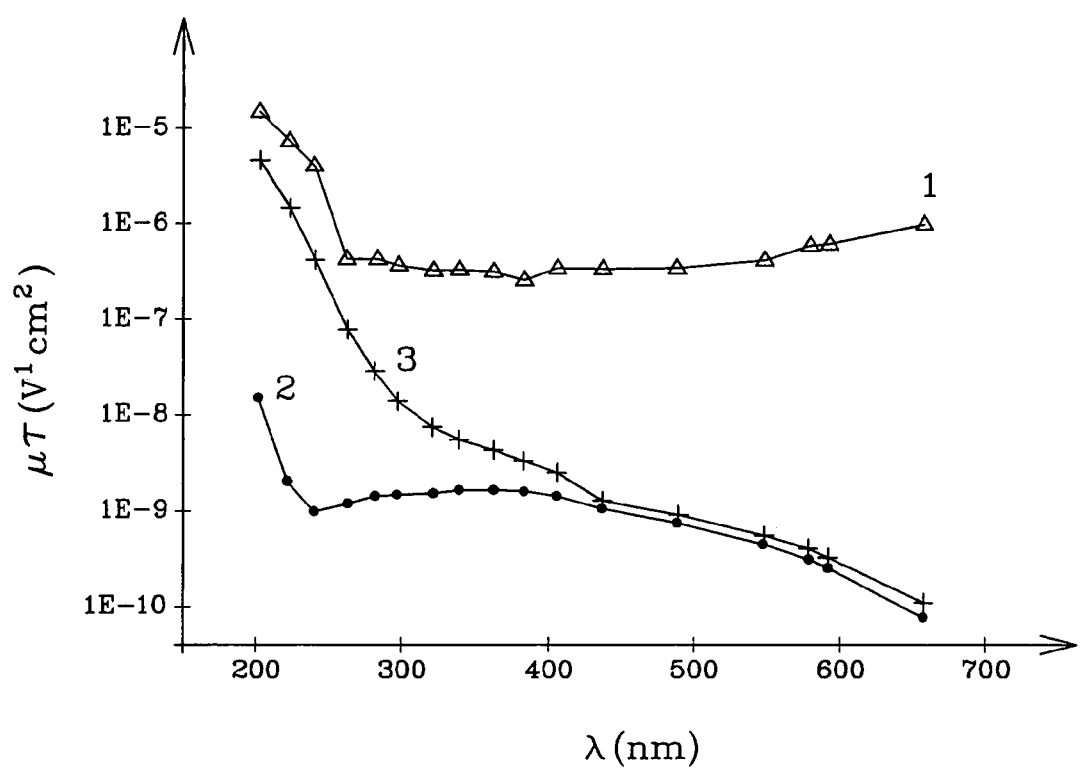
FIG. 10 illustrates in an orthonormal reference system, values for the leak current surface density for different sizes of pixels.

FIG. 10 illustrates the mu tau product obtained on metal-(pm-Si:H)-metal structures versus wavelength,. Curve 1 is the response of a thick sample of polymorphous material (of the order of 1.5 μm) which has low selectivity (about 10). The thickness of the polymorphous layer was reduced in order to increase the ratio of UV to visible light selectivity. Curve 2 shows the response of a polymorphous layer with a thickness of the order of 200 Å. This curve shows a substantially constant mu tau product between wavelengths of 250 and 500 nanometers. Wavelength selectivity for this layer will therefore be low. Curve 3 is the response of a thin layer of polymorphous silicon with a thickness identical with that of curve 2 but which differs from the latter by the deposition conditions. This curve shows a strong decrease of the mu tau product when passing from a wavelength of 200 nanometers to a wavelength of 400 nanometers, so it is possible to obtain selectivity among the different wavelengths favouring ultraviolet wavelengths. A selectivity of the order of 38,000 is obtained.

The upper electrode 25 illustrated in FIG. 9 for the ultraviolet imager may, as in reference document [2], have the shape of a metal grid.

Figure 3:
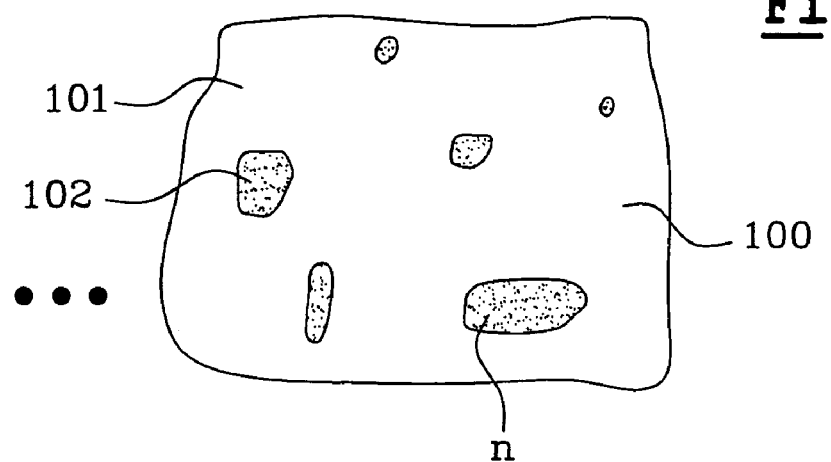
FIG. 3 is a schematic illustration of the structure of polymorphous silicon.
Figure 11:
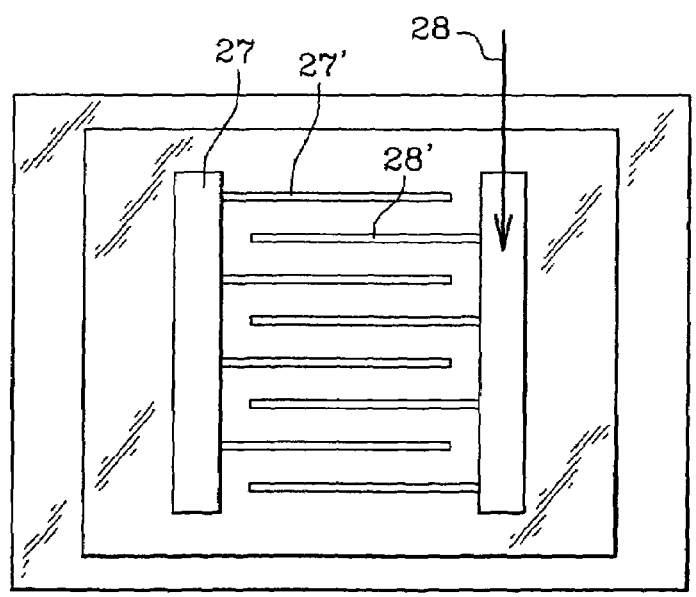
FIG. 11 illustrates an embodiment of the invention wherein the photosensitive material is polymorphous silicon.

It may also as illustrated in FIG. 11, exist as two combs 27, 28 including interdigitated teeth 27', 28' respectively. Both combs are isolated from each other so that they may be set at different potentials. Finally, electrode 25 may also exist as a thin silver layer. Reference article [6] and notably its FIG. 3 show different spectral responses depending on the thickness of the silver layer forming an upper electrode. A wavelength peak around 320 nanometers may be obtained with the silver layer, the bandwidth from this peak being reduced when the thickness of the silver layer varies between 10 nanometers and 130 nanometers for example.

It should be specified that in the embodiment of the detection brick 50 which has just been described, one PIN diode is formed per pixel. One of the contacts of the PIN diode is formed by the upper surface of pad 5, 5'. Electrodes 64, 94 may be made in an n doped semiconductor, for example in amorphous hydrogenated carbonaceous silicon a-SiC:H, doped with arsenic. The intrinsic layer is formed with hydrogenated silicon pm-Si:H. The p layer 79 is again hydrogenated amorphous silicon a-Si:H, doped with boron and optionally with carbon.

Alternative embodiments of the detection brick 50 will now be described. These alternatives independently from each other, relate to variations on the layer 76 and on the electrode 25.

Instead of being in the n-i-p order as described above, the stacking of layers forming each of the diodes above pads 5, 5' may also be p-i-n.

It is not mandatory to have electrodes 64, 94 above each pad 5, 5'. A barrier may be obtained by directly depositing an intrinsic layer i, unintentionally doped, directly above the interconnection brick 12'. In this case, at least the upper layer of the pads 5, 5' will be a metal, for example platinum, tungsten or palladium. An n layer or a p layer may be located above layer i.

The stacking of layers above pads 5, 5' may also comprise a p layer or an n layer, then layer i, this i layer being directly in contact with the electrode 25, which, in this case, is metal, for example platinum, tungsten or palladium.

In all the cases which have just been described above, layer i and at least a sublayer of this i layer, are in polymorphous silicon.

Surprisingly, it was seen that using polymorphous silicon as sensitive material led to imagers having reduced image retention and very high sensitivity.

Figure 12:
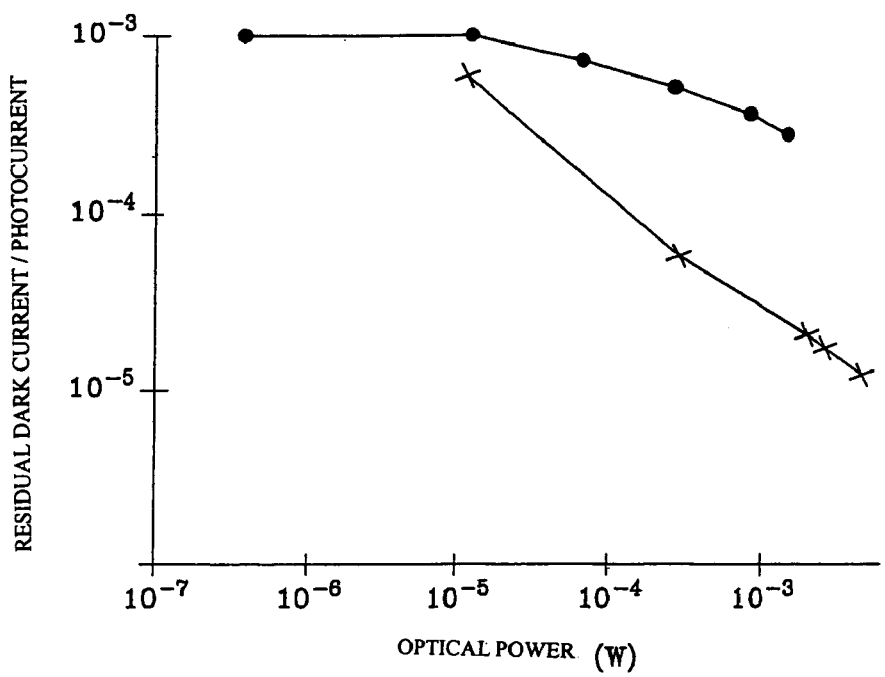
FIG. 12 illustrates a top view of a detector according to the invention wherein the upper electrode is formed with two interdigitated finger combs.

FIG. 12 shows the gain in performance obtained on a device according to the invention. This figure illustrates two curves a and b. Each of the curves illustrates the dark current remaining for 0.2 seconds after interruption of incident light, with the optical power plotted in abscissa. The curve a illustrates this dark current for hydrogenated amorphous silicon, and curve b shows this same current for a layer using polymorphous silicon according to the invention. It is seen that the dark current fraction after light extinction is substantially lower with polymorphous silicon than with amorphous silicon. It follows that the image retention effect obtained with an imager according to the invention is substantially reduced by using a pixel based on a polymorphous material.

It was further seen that with polymorphous material time stability of imagers may notably be increased, especially under illumination. With polymorphous material, dark leakage currents of the order of $10^{-11}$ A/cm$^2$ may be attained with excellent spectral response. The measured external quantum efficiencies attain more than 30% in the vicinity of the incident wavelength of 300 nm, and the width of the forbidden gap for polymorphous silicon is greater than that for amorphous silicon, so the obtained photocurrent in the vicinity of 700 nm, i.e., in red light and near infrared light, is lower, which has the advantage of no longer requiring coloured filters for eliminating infrared parasitic radiation, as compared with crystalline silicon CMOS technologies.

Figure 13:
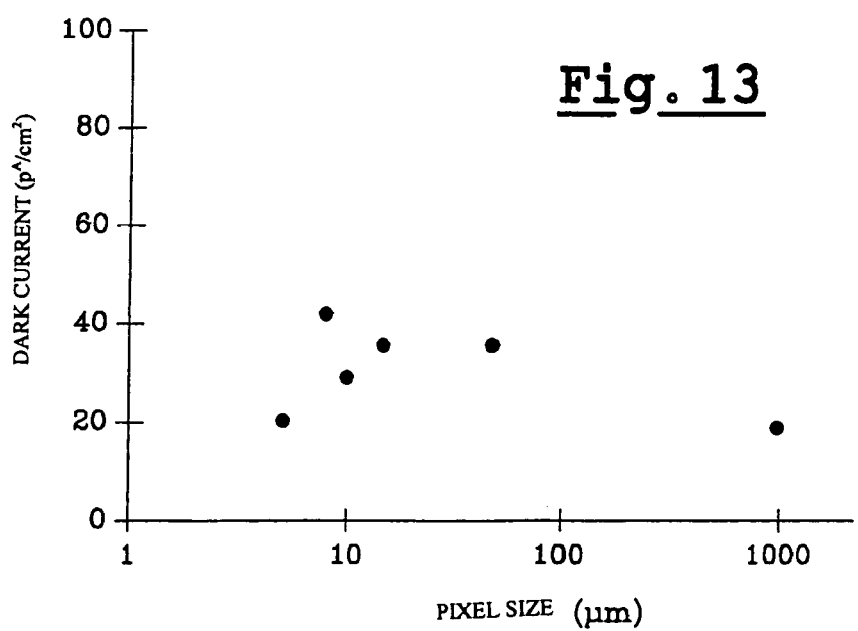
FIG. 13 illustrates in an orthonormal reference system, values of the leak current surface density for different sizes of pixels.

The advantage of the low dark leakage current is maintained regardless of the size of the pixel. Measurements made by the applicant and illustrated on the graph of FIG. 13, show that with polymorphous silicon, the points representing the dark leakage current versus the size of the pixel have substantially the same ordinate: reducing the size of the pixel has little influence on its dark leakage current.

LIST OF QUOTED DOCUMENTS

[1] U.S. Pat. No. 6,114,739
[2] Article of M. Razeghi and A. Rogalski entitled "Semiconductor ultraviolet detectors"; Applied Physics Reviews; May 15, 1996; pages 7433–7473.
[3] U.S. Pat. No. 5,682,037
[4] Article from the Journal of Applied Physics, volume 86, No. 2, of R. Meaudre et al., pages 946–950, entitled "Midgap density of states in hydrogenated polymorphous silicon"
[5] Article from the Journal of Non-crystalline Solids 299-302 (2002) pages 284–289 of A. Fontcuberta et al.
[6] U.S. Pat. No. 6,018,187
[7] Article from the Journal of Applied Physics, volume 87, No. 4 of R. Vanderhaghen et al., pages 1874–1881, entitled "The origin of current gain under illumination in amorphous silicon n-i-p-i-n structures".
[8] Article of Marko Topic et al.—Applied Physics Letters—volume 78—No. 16, p. 2387–2389.

The invention claimed is:

1. An assembly of sensors formed as an imager each sensor delivering a signal corresponding to one pixel of the image, and having,
    a detection brick with a detection zone including a photosensitive material,
    a brick for addressing and optionally processing signals from the sensors, this brick notably bearing an addressing circuit and,
    an interconnection brick located between the detection brick and the addressing brick, each brick bearing connection pads connecting the sensors of the imager to the addressing circuit, so that the signals from the sensors are individualized,
    characterized in that the photosensitive material of the detection brick contains at least one polymorphous silicon layer.

2. The assembly of the sensors forming an imager, according to claim 1, characterized in that the polymorphous silicon layer has a thickness less than 4,000 angstroms.

3. The assembly of the sensors forming an imager, according to claim 1, characterized in that the interconnection brick is formed by pads (5, 5') embedded in an insulator (1, 2, 3).

4. The assembly of the sensors forming an imager, according to claim 1, characterized in that the interconnection pads (5, 5') are either in aluminium or copper or tungsten or chromium.

5. The assembly of the sensors forming an imager, according to claim 3, characterized in that the insulating material embedding the pads, is formed by a stack of dielectric layers forming Bragg mirrors.

6. The assembly of the sensors forming an imager, according to claim 3, characterized in that electrodes (64, 94) are formed above the pads (5, 5'), these electrodes having a lower surface electrically coupled with a pad (5) and an upper surface, the upper surface of the electrode having a larger surface dimension than the lower surface in contact with the pad.

7. The assembly of the sensors forming an imager, according to claim 6, characterized in that the upper surface of the electrodes is cup-shaped.

8. The assembly of the sensors forming an imager, according to claim 6, characterized in that a lower portion of each electrode is embedded in an insulator layer, an upper portion of this electrode being just above said insulator layer.

9. The assembly of the sensors forming an imager, according to claim 8, characterized in that the insulator layer surrounding a lower portion of the electrodes consists of a stack of layers forming Bragg mirrors.

10. The assembly of the sensors forming an imager, according to claim 6, characterized in that the electrodes (64, 94) are either in aluminium or copper or tungsten or titanium or chromium or titanium nitride or a doped semiconductor or an organic conductor or even finally a composite stack of the aforementioned materials.

11. The assembly of the sensors forming an imager, according to claim 6, characterized in that the polymorphous silicon layer (76) is placed above the layer including the insulator and the electrodes.

12. The assembly of the sensors forming an imager, according to claim 11, characterized in that at least one upper silicon layer (79) has a lower portion containing carbon and an upper portion containing boron.

13. The assembly of the sensors forming an imager, according to claim 1, characterized in that the thickness of the polymorphous silicon layer (46) is between 0.5 and 2 µm.

14. The assembly of the sensors forming an imager, according to claim 1, characterized in that the detection zone including the polymorphous silicon is an intrinsic zone of a PIN or NIP diode.

15. The assembly of the sensors forming an imager, according to claim 12, characterized in that electrodes 64, 94, are formed above pads 5, 5', and these electrodes being etched in an n or p material layer.

16. The assembly of the sensors forming an imager, according to claim 10, characterized in that at least one of the electrodes contains an n doped material.

17. The assembly of the sensors forming an imager, according to claim 10, characterized in that at least one of the electrodes contains a p doped material.

18. The assembly of the sensors forming an imager, according to claim 9, characterized in that at least one of the electrodes contains an n doped material.

19. The assembly of the sensors forming an imager, according to claim 1, characterized in that the polymorphous material layer is an intrinsic layer placed above the electrodes.

20. The assembly of the sensors forming an imager, according to claim 2, characterized in that the polymorphous material layer is an intrinsic layer placed above the electrodes.

21. The assembly of the sensors forming an imager, according to claim 12, characterized in that the polymorphous material layer is an intrinsic layer placed above the electrodes.

22. The assembly of the sensors forming an imager, according to claim 19, characterized in that a p doped layer is placed above the amorphous silicon layer, thereby producing a NIP diode.

23. The assembly of the sensors forming an imager, according to claim 20, characterized in that a p doped layer is placed above the amorphous silicon layer, thereby producing a NIP diode.

24. The assembly of the sensors forming an imager, according to claim 21, characterized in that a p doped layer is placed above the amorphous silicon layer, thereby producing a NIP diode.

25. The assembly of the sensors forming an imager, according to claim 19, characterized in that an n doped layer is placed above the intrinsic amorphous silicon layer thereby producing a PIN diode.

26. The assembly of the sensors forming an imager, according to claim 20, characterized in that an n doped layer is placed above the intrinsic amorphous silicon layer thereby producing a PIN diode.

27. The assembly of the sensors forming an imager, according to claim 21, characterized in that an n doped layer is placed above the intrinsic amorphous silicon layer thereby producing a PIN diode.

28. The assembly of the sensors forming an imager, according to claim 6, characterized in that the pads include an upper metal surface, and in that the polymorphous material layer is directly placed in contact with the pads.

29. The assembly of the sensors forming an imager, according to claim 28, characterized in that an n doped layer is placed above the polymorphous silicon layer.

30. The assembly of the sensors forming an imager, according to claim 28, characterized in that a p doped layer is placed above the polymorphous silicon layer.

31. The assembly of the sensors forming an imager, according to claim 30, characterized in that the electrode is in conducting transparent oxide.

32. The assembly of the sensors forming an imager, according to claim 30, characterized in that the electrode is produced in a layer of a metal partly transparent to ultraviolet radiation.

33. The assembly of the sensors forming an imager, according to claim 30, characterized in that the upper electrode is a metal grid.

34. The assembly of the sensors forming an imager, according to claim 30, characterized in that the electrode is formed by two combs each having teeth, the teeth being interdigitated.

35. A method for producing an assembly of photo-detectors according to claim 6, characterized in that:

after producing a substrate notably including an addressing circuit and optionally signal processing circuits, one or several layers of insulating materials are deposited, said layer is etched so as to form holes in this layer, some holes are filled with a conducting material thereby forming interconnection pads (5, 5'), mechano-chemical polishing is carried out optionally, one or more insulating material sublayers are deposited, said insulating material sublayer is etched above pads (5, 5'), a layer is deposited above the etched insulator layer, thereby forming a non-planar conducting material layer, cups appearing above the pads, the conducting material layer which has just been deposited, is etched, in order to form electrodes separated from each other, an unintentionally doped polymorphous material layer is deposited, a doped layer is deposited, a conducting material (24) layer forming an upper electrode is deposited finally.

36. The method according to claim 35, characterized in that the temperature for depositing the polymorphous material is between 175° C. and 250° C.

37. The method according to claim 35, characterized in that the polymorphous material deposit is followed by a deposit of a layer containing carbon at least in its lower portion.

38. The method for producing an assembly of sensors according to claim 3, characterized in that:

the method comprises a step for depositing a polymorphous silicon layer, this layer coming into contact with either a metal upper portion of conducting pads, or n doped or p doped electrodes, themselves in contact with a conducting pad, this step for depositing the polymorphous silicon layer being produced by a PECVD (Placement Enhanced Chemical Vapor Deposition) method, and at a temperature between 150 and 250° C.

* * * * *